United States Patent
Treyer et al.

(10) Patent No.: US 8,989,597 B2
(45) Date of Patent: Mar. 24, 2015

(54) ELECTRICALLY CONTROLLABLE COLLIMATOR IN A LASER RESONATOR

(75) Inventors: Thomas Treyer, München (DE); Sylvia Smolorz, Mountain View, CA (US)

(73) Assignee: Xieon Networks S.a.r.l., Luxembourg (LU)

( * ) Notice: Subject to any disclaimer, the term of this patent is extended or adjusted under 35 U.S.C. 154(b) by 282 days.

(21) Appl. No.: 13/508,440

(22) PCT Filed: Nov. 6, 2009

(86) PCT No.: PCT/EP2009/064749
§ 371 (c)(1),
(2), (4) Date: May 31, 2012

(87) PCT Pub. No.: WO2011/054392
PCT Pub. Date: May 12, 2011

(65) Prior Publication Data
US 2012/0230704 A1    Sep. 13, 2012

(51) Int. Cl.
| H04B 10/04 | (2006.01) |
| H01S 3/13 | (2006.01) |
| G02B 3/14 | (2006.01) |
| G02B 26/00 | (2006.01) |
| H01S 3/137 | (2006.01) |
| H01S 3/106 | (2006.01) |
| H01S 5/0687 | (2006.01) |
| H01S 5/14 | (2006.01) |

(52) U.S. Cl.
CPC ............... *H01S 3/1307* (2013.01); *G02B 3/14* (2013.01); *G02B 26/005* (2013.01); *H01S 3/137* (2013.01); *H01S 3/1062* (2013.01); *H01S 5/0687* (2013.01); *H01S 5/141* (2013.01)
USPC ............................... 398/182; 398/85; 398/88

(58) Field of Classification Search
CPC .... H04B 10/503; H04B 10/548; H04B 10/58; H04B 10/50572; H04B 10/50577
USPC .............................. 398/85, 88, 182, 200–201
See application file for complete search history.

(56) References Cited

U.S. PATENT DOCUMENTS

| 7,385,755 | B2 | 6/2008 | Hendriks et al. | |
| 7,697,187 | B2 | 4/2010 | Kato et al. | |
| 2004/0213131 | A1* | 10/2004 | Kimura et al. | 369/112.03 |
| 2005/0122857 | A1* | 6/2005 | Sato et al. | 369/44.23 |
| 2006/0239170 | A1* | 10/2006 | Hashimoto | 369/112.03 |
| 2007/0268806 | A1* | 11/2007 | Yamasaki et al. | 369/112.02 |
| 2010/0110532 | A1* | 5/2010 | Takemoto et al. | 359/316 |

FOREIGN PATENT DOCUMENTS

| EP | 1 906 214 A1 | 4/2008 |
| WO | 2004/102251 A1 | 11/2004 |

* cited by examiner

*Primary Examiner* — Dzung Tran
(74) *Attorney, Agent, or Firm* — Nelson Mullins Riley & Scarborough LLP

(57) ABSTRACT

A collimator for a laser assembly includes a first electrostatically controllable liquid lense having a first optical axis and a second electrostatically controllable liquid lense having a second optical axis aligned with the first optical axis. A laser is provided and has such a collimator. Finally, a transmitter uses the laser for optical data transmission.

17 Claims, 2 Drawing Sheets

ELECTRICALLY CONTROLLABLE COLLIMATOR IN A LASER RESONATOR

TECHNICAL FIELD OF THE INVENTION

The invention provides a collimator for a laser assembly, such a laser assembly and a transmitter for an optical data network comprising such a laser assembly.

BACKGROUND OF THE INVENTION

Tunable lasers are in high demand in optical communication systems because of their versatility. They are widely deployed in core networks but so far have been too expensive for use in access networks, i.e. in data transmission devices located at the customers' premises. Designs which are currently in use typically rely on sophisticated optoelectronic laser chips. An alternative is the extended cavity laser (ECL) which uses a low-cost gain chip combined with a mechanically tuned thin-film filter and a ball lens for collimation. The mechanically tunable laser design commonly offers three parameters with which the laser wavelength can be adjusted: the filter position (coarse-tuning of the laser gain profile), the laser current (fine-tuning of the cavity modes), and the laser temperature (fine-adjustment of the phase).

Using the laser temperature to fine-adjust the phase requires a costly Peltier cooler/heater and has the additional disadvantage of a slow response speed. As an alternative a cavity mirror may be moved by using a piezo-electric element which requires moving parts and therefore is expensive and not robust enough. Furthermore a semiconductor phase tuning section may be used, however, this needs optical pumping. Due to coupling losses between chips the gain and phase control section should be integrated on a single chip which requires sophisticated lithography which again is costly.

SUMMARY OF THE INVENTION

The invention has been made in an effort to provide an inexpensive way of fine-adjusting the phase of a laser assembly that may overcome at least some of the above-mentioned disadvantages of the prior art.

A first aspect of the invention provides a collimator for a laser assembly including a first electrostatically controllable liquid lens having a first optical axis and a second electrostatically controllable liquid lens having a second optical axis aligned with the first optical axis. The collimator may be used instead of the ball lens used for collimating the laser mode. The focal lengths of the first and second electrostatically controllable liquid lenses may be adjusted synchronously in order to keep the focal length of the assembly constant while changing the optical path length of the cavity and therefore the phase matching condition.

As shown in FIG. 1, an electrostatically controlled liquid lens 10 may comprise a drop 11 of a hydrophobic liquid (e.g. silicon oil, 1-bromo-dodecane or similar substances) with an index of refraction $n_2$ attached to a specially prepared surface. The drop 11 may be immersed in a conducting liquid 12 such as an aqueous $Na_2SO_4$ solution with an index of refraction $n_1$. The drop 11 may be positioned on a surface area which may be treated to be hydrophobic and including a ring electrode 13. When a voltage is applied to the ring electrode 13, the drop 11 pulls away from the ring electrode 13 creating a steeper surface and decreasing the focal length of the liquid lens 10.

The invention includes the insight that an assembly of two liquid lenses may be controlled to have a constant focal length f while changing the focal lengths of each of the liquid lenses. However, since the form of the surface area of the drop 11 changes, so does the distance light travels through the drop of hydrophobic liquid having the index of refraction $n_2$. Since the optical path length is the product of the distance light travels in a medium and the index of refraction of the medium, the phase condition may be fine-tuned by controlling the shape of each of the liquid lenses while maintaining the focal length f of the collimator constant. Of course, the focal length f of the collimator may also be controlled which overcomes the need of precise mechanical fine-tuning of the laser assembly during the manufacturing process. However, once an optimum focal length f has been achieved, the focal length will be maintained constant while fine-adjusting the phase as described above.

Liquid lenses are designed for use in consumer application such a digital cameras or cameras used in mobile phones and therefore represent low-cost technology. Thus, the collimator according to the first aspect of the invention may be provided at low cost. In addition the collimator has an additional advantage in that the phase of a laser assembly may be fine-adjusted easily and rapidly because of the electric nature of the control signal and the high response speed of the liquid lenses. A further advantage of the collimator of the invention is that power consumption is low due to the electrostatic nature of the liquid lenses.

A second aspect of the invention provides a laser including a gain medium and a semitransparent mirror arranged at opposite sides of a laser cavity, a control circuit and a collimator according to the first aspect of the invention. Herein, the term "semitransparent" is not restricted to mirrors reflecting 50% of the incident light but rather describes the fact that the mirror reflects some of the incident light and transmits another part of the incident light. In laser technology semitransparent mirrors commonly reflect 80% or more of the incident light.

Preferably the collimator is arranged between the semitransparent mirror and the gain medium. In addition the laser may further include a dielectric filter arranged between the collimator and the semitransparent mirror.

The control circuit may have a first output connected to the first electrostatically controllable liquid lens and a second output connected to the second electrostatically controllable liquid lens. The control circuit may be adapted to provide a first control voltage for controlling the focal length of the first electrostatically controllable liquid lens to the first output and a second voltage for controlling the focal length of the second electrostatically controllable liquid lens to the second output, wherein a sum of the first voltage and the second voltage is set to a predetermined constant value.

A third aspect of the invention provides a transmitter for an optical data network comprising a laser according to the second inventive aspect.

The transmitter may further comprise an optical reference source adapted to provide an optical reference signal, an optical mixer adapted to mix the optical reference signal and an output signal of the laser and to thereby generate an intermediate frequency signal, and a local reference source adapted to provide a local reference frequency. The control circuit of the laser may be adapted to compare the intermediate frequency with the local reference frequency, preferably a quartz reference, and to control the collimator to increase the phase when the output frequency is higher than the local reference frequency and to decrease the phase when the output frequency is lower than the local reference frequency. In this way very stable control of the laser frequency is possible.

The control circuit of the transmitter may be adapted to determine an amplitude of the intermediate frequency signal.

The control circuit may then be adapted to control the focal length of the collimator such that the amplitude of the output signal of the laser reaches a maximum. This approach may be implemented in all cases where the amplitude of the optical reference signal is constant or changing very slowly.

Alternatively, the transmitter may further comprise a monitor diode adapted to provide a feedback signal comprising an information about an amplitude of an output signal of the laser. Then, the control circuit may be adapted to control the focal length of the collimator such that the amplitude of the output signal of the laser reaches a maximum.

Numerous algorithms may be used for arriving at a maximum laser amplitude. E.g. a sweep through the different voltage settings for controlling the phase may be carried out measuring the amplitude for each voltage setting. Alternatively a search algorithm may be employed wherein the voltage is adjusted by a small step and the amplitude for the new voltage setting is compared to that for the previous voltage setting. If the amplitude has decreased, the direction of steps is reversed. Alternatively a low-frequency pilot tone may be used. Here, the focus is modulated continuously with a periodical signal, e.g. a sinus modulation. The control circuit may correlate the pilot tone with the measured amplitude and may derive the optimal focus control signal from that comparison.

The arrangement of lenses according to the invention allows to tune focus and phase independently. Nevertheless a modification of the focus may slightly affect the phase setting due to imperfections of the lenses and vice versa. To handle these interdependencies, the control block may apply different time constants to the filtering of the control signals for phase and focus. For example the time constant for phase control may be an order of magnitude smaller than that for focus control.

The algorithm for controlling focus may settle at a local extremum if multiple extrema exist in the amplitude. This problem can be circumvented by manual adjustment during manufacture which ensures that the algorithm starts near the optimum.

To avoid the manual adjustment an automatic adjustment routine may be carried out after rebooting or cold-starting the transmitter. During this routine the phase may be set to a fixed value and different focus settings may be tried. For each focus setting the laser current is modified, e.g. the laser current may be ramped up or down, while the amplitude of the laser is measured. From these measurements the threshold current of the laser for the given focus setting can be derived. Several focus settings are tested in this way, e.g. using a linear sweep over a range of focus settings, and the focus setting with the lowest threshold current will be selected for device operation.

If the transmitter is implemented in an optical data transmission device comprising a heterodyne receiver, the optical reference source may be the optical local oscillator of the receiver and the optical mixer may be the photo diode of the receiver.

BRIEF DESCRIPTION OF THE DRAWINGS

The invention will be described more thoroughly referring to a plurality of figures which show.

DETAILED DESCRIPTION

Figure 2:
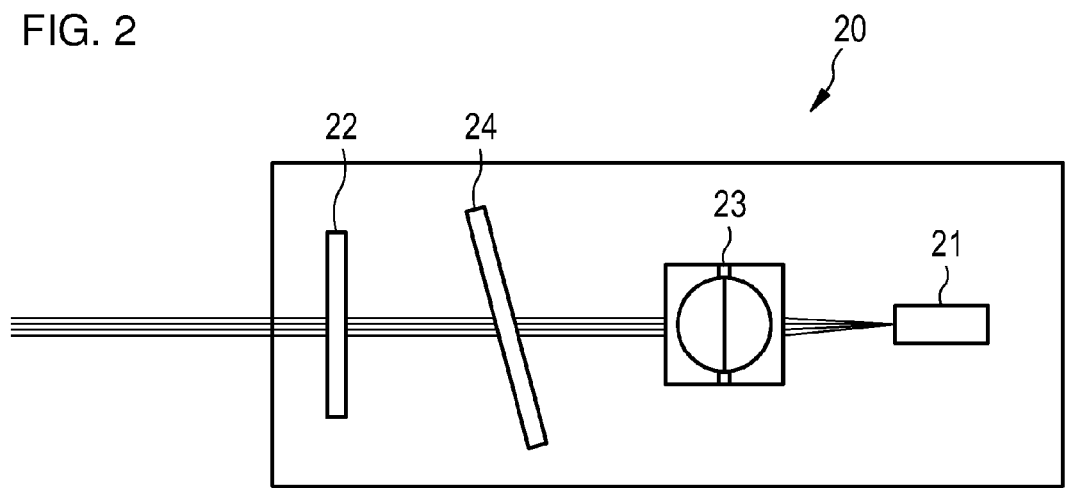
FIG. 2 a laser using a collimator according to the invention.

FIG. 2 shows a laser 20 using a collimator 23 according to the invention. A gain medium 21 and a semitransparent mirror 22 are located at opposite ends of a laser cavity. Since the gain medium 21 emits a mode having a finite angle, a collimator 23 is provided to collimate the light emitted by the gain medium 21. The focal length of the collimator 23 is chosen such that light reflected from the semitransparent mirror 22 is focussed at the same angle as the angle with which the gain medium 21 emits light. The laser 20 may further include a dielectric filter 24 which provides a coarse tuning mechanism which selects one of the cavity modes. The fine tuning of the modes is then done by phase adjustment.

Figure 1:
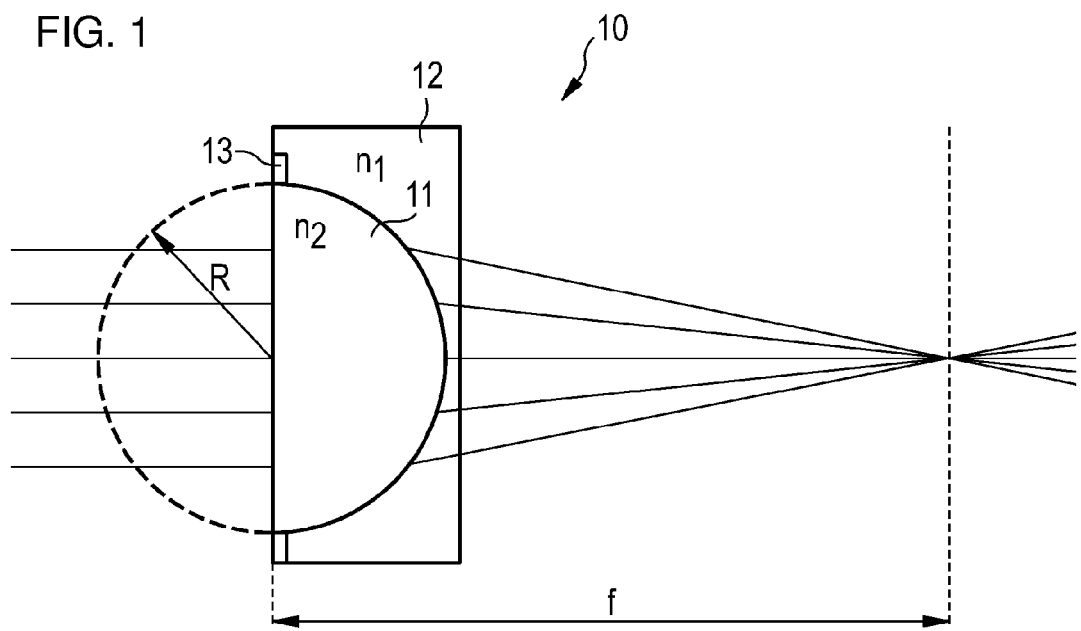
FIG. 1 an electrostatically controllable liquid lens.
Figure 3:
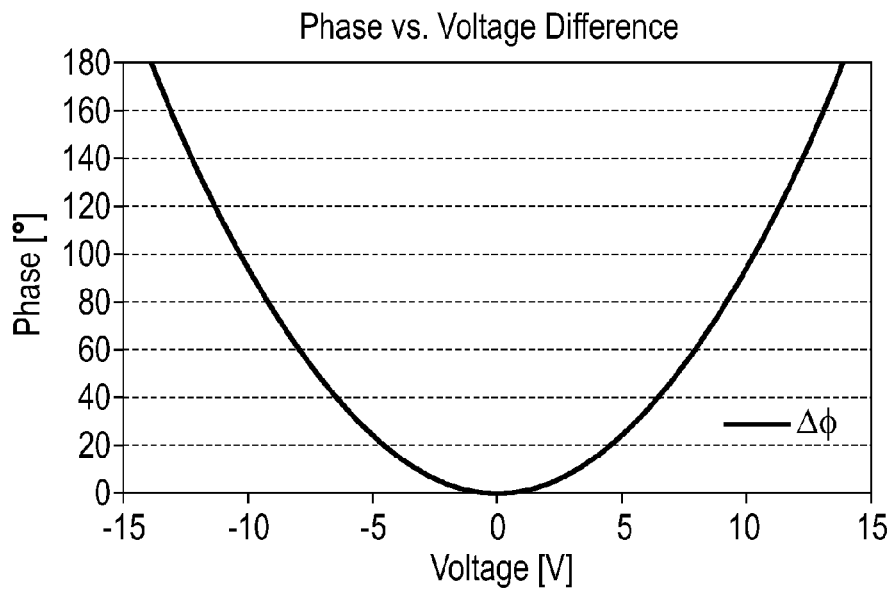
FIG. 3 a diagram illustrating the dependence of phase angle on the input voltage.

FIG. 3 shows a diagram illustrating the dependence of phase angle on the input voltage of an exemplary liquid lens (e.g. the liquid lens 10 of FIG. 1) comprising a drop of 1-bromo-dodecane in an aqueous $Na_2SO_4$ solution. The optical power of a liquid lens 10 depends linearly on the voltage applied to the ring electrode 13. The optical power of the collimator of the invention can be described as this:

$$\frac{1}{f} = \frac{1}{f_1} + \frac{1}{f_2} = \alpha V_1 + \alpha V_2 + 2\beta$$

where f is the focal length of the collimator, $f_1$ and $f_2$ are the focal lengths of the first liquid lens and the second liquid lens, respectively, and $$\frac{1}{f_1} = \alpha V_i + \beta$$

describes the relationship between the focal length $f_i$ and the applied voltage $V_i$. $\alpha$ and $\beta$ are constants which depend on the details of the assembly.

This construction has several advantages:
the tolerance for the distance of the lens assembly to the gain chip is greatly enhanced compared to the use of a fixed lens because the focal length can be adjusted after the assembly
adjusting the cavity phase requires no moving parts
because the optical power of each lens depends linearly on the applied voltage, all that needs to be done to keep the optical power of the assembly constant is to keep the sum of the applied voltages constant. This suggests the use of a simple power divider as controlling element (see FIG. 4) wherein $V_1 = V + \Delta V$ and $V_2 = V - \Delta V$.
the sensitivity of the device to voltage changes can be engineered by proper choice of the liquids; if the difference in refractive indices $n_1$ and $n_2$ is small, the same voltage change will result in a smaller phase change than if the difference is large.

The change in phase can be calculated as follows:

$$\Delta = (n_2 - n_1)\frac{2\pi}{\lambda}\Delta z$$

where $\Delta z$ is the change in thickness of the entire lens assembly. For a spherical lens, which is a good approximation, the radius R of the sphere is related to the focal length f as $$R = \frac{n_1}{n_2 - n_1}f$$

and therefore the change in phase can be reformulated:

$$\Delta = (n_2 - n_1)\frac{2\pi}{\lambda}\left(\frac{1}{\alpha V + \beta + \alpha \Delta V} + \frac{1}{\alpha V + \beta - \alpha \Delta V} - \frac{2}{\alpha V + \beta}\right)$$

$$= (n_2 - n_1)\frac{2\pi}{\lambda}\left(\frac{2\alpha^2 \Delta V^2}{(\alpha V + \beta)^3 - \alpha^2 \Delta V^2(\alpha V + \beta)}\right)$$

FIG. 3 shows the resultant diagram for Δϕ as a function of the input voltage V. The voltages in the example of FIG. 3 are comparatively high, however, power consumption remains low because the device is electrostatic. As already mentioned above, other materials may be chosen for the liquid lenses resulting in a higher difference between the indices of refraction $n_2$ and $n_2$ to arrive at lower control voltages.

Figure 4:
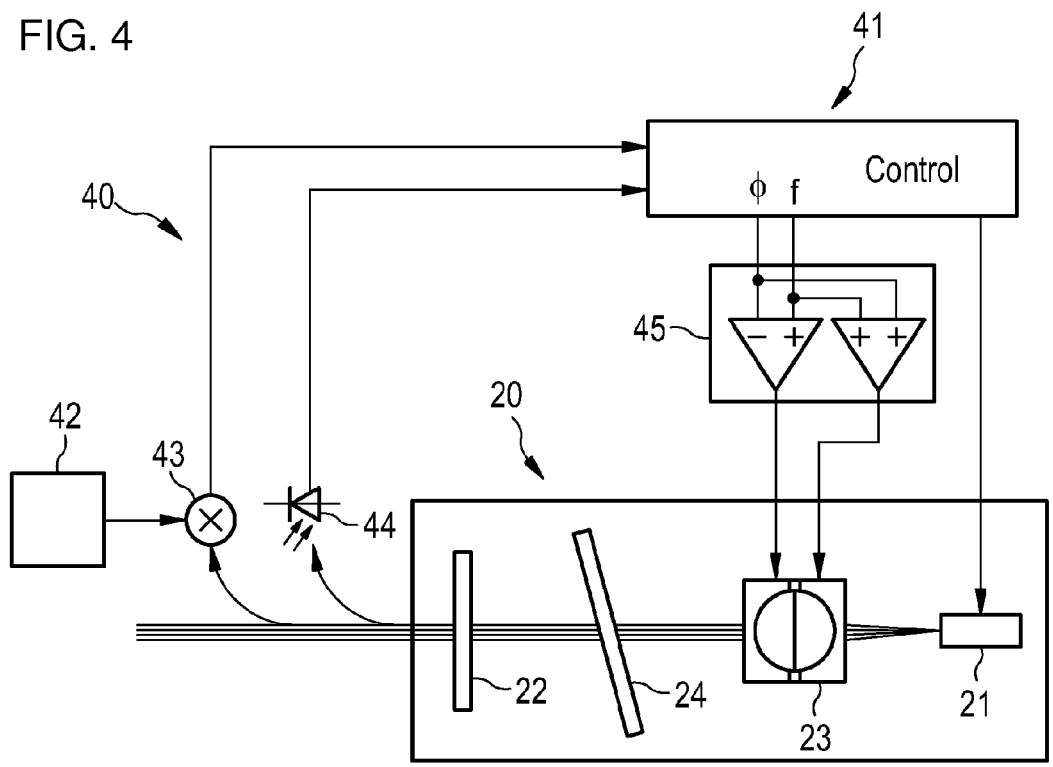
FIG. 4 a transmitter comprising a laser according to the invention.

FIG. 4 shows a transmitter 40 comprising a laser 20 according to the invention. Those parts of the transmitter 40 which are not required for understanding the invention have been omitted for ease of description. The laser 20 of the transmitter 40 is illustrated in FIG. 2 in detail. Accordingly, a detailed description of its components will be omitted at this place.

The transmitter 40 comprises a control circuit 41 generating control signals for adjusting phase and focal length of the collimator 23 of the laser 20 (designated as ϕ and f in FIG. 4). In FIG. 4 a separate power divider 45 is shown which may also form part of the control circuit 41. The power divider 45 converts the control signals for adjusting phase and focal length of the collimator 23 into control signals suitable for the liquid lenses of the collimator 23.

In addition to the above, the control circuit 41 provides a laser current to the gain medium 21. The transmitter 40 further comprises an optical reference source 42 which provides an optical reference signal having a substantially constant wavelength or optical reference frequency. A part of the laser beam generated by the laser 20 and the optical reference signal are mixed in an optical mixer 43 thereby generating an intermediate signal having a frequency corresponding to a frequency difference between the optical reference signal and the frequency of the laser beam. For example a photo diode may be used as an optical mixer 43 yielding an electric signal which can be processed by the control circuit 41 easily. The control circuit 41 can control the phase of the laser 20 by comparing the intermediate frequency signal to a fixed reference signal such as a reference frequency provided by a quartz oscillator and adjusting the phase accordingly. In this way the phase of the laser 20 and thus the frequency of the laser 20 are controlled to always correspond to the frequency of the optical reference source minus the frequency of a fixed reference signal similarly to a Phased-locked Loop (PLL).

The exemplary transmitter 40 shown in FIG. 4 further comprises a monitor diode 44 which is adapted to generate a signal comprising an information about an amplitude of the laser beam generated by the laser 20 and provide this signal to the control circuit 41. The process of adjusting phase and frequency of the laser carried out by the control circuit 41 has been described above in detail.

REFERENCES 10 liquid lens
11 drop
12 conducting liquid
13 ring electrode
20 laser
21 gain medium
22 semitransparent mirror
23 collimator
24 dielectric filter
40 transmitter
41 control circuit
42 optical reference source
43 optical mixer
44 monitor diode
45 power divider
R radius
F focal length
$n_1$, $n_2$ refractive indices

The invention claimed is:

1. A collimator for a laser assembly, the collimator comprising:
    a first electrostatically controllable liquid lens having a first optical axis; and
    a second electrostatically controllable liquid lens having a second optical axis aligned with the first optical axis,
    wherein each of said liquid lenses is independently controllable, the liquid lenses are arranged close together forming a ball lens and the ball lens contains liquids with different refractive indices.

2. The collimator according to claim 1, wherein the collimator is adapted to maintain a focal length constant while changing an optical path length of the collimator according to first and second control signals received by said first and second electrostatically controllable liquid lenses, respectively.

3. The collimator according to claim 1, wherein said first electrostatically controllable liquid lens and said second electrostatically controllable liquid lens each contain a conducting liquid, a drop of a hydrophobic liquid having a first refractive index immersed in said conducting liquid, a second refractive index being different from the first refractive index, and a ring electrode adapted to apply an electric field to said drop of said hydrophobic liquid.

4. The collimator according to claim 3, wherein:
    said hydrophobic liquid contains one of silicon oil or 1-bromo-dodecane; and
    said conducting liquid is an aqueous $Na_2SO_4$ solution.

5. A laser, comprising:
    a laser cavity;
    a gain medium;
    a semitransparent mirror, said gain medium and said semitransparent mirror are disposed on opposite sides of said laser cavity;
    a control circuit; and
    a collimator having a first electrostatically controllable liquid lens with a first optical axis and a second electrostatically controllable liquid lens with a second optical axis aligned with the first optical axis,
    wherein each of said liquid lenses is independently controllable, the liquid lenses are arranged close together forming a ball lens and the ball lens contains liquids with different refractive indices,
    wherein said collimator is disposed between said semitransparent mirror and said gain medium.

6. The laser according to claim 5, further comprising a dielectric filter disposed between said collimator and said semitransparent mirror.

7. The laser according to claim 5, wherein said control circuit has a first output connected to said first electrostatically controllable liquid lens and a second output connected to said second electrostatically controllable liquid lens, said control circuit being adapted to provide a first voltage for controlling a focal length of said first electrostatically controllable liquid lens to said first output and a second voltage for controlling a focal length of said second electrostatically controllable liquid lens to said second output, wherein a sum of the first voltage and the second voltage is set to a predetermined constant value.

8. A transmitter for an optical data network, the transmitter comprising:
   a laser, containing:
   a laser cavity;
   a gain medium;
   a semitransparent mirror, said gain medium and said semitransparent mirror are disposed on opposite sides of said laser cavity;
   a control circuit; and
   a collimator having a first electrostatically controllable liquid lens with a first optical axis and a second electrostatically controllable liquid lens with a second optical axis aligned with the first optical axis,
   wherein each of said liquid lenses is independently controllable, the liquid lenses are arranged close together forming a ball lens and the ball lens contains liquids with different refractive indices,
   wherein the collimator is disposed between said semi transparent mirror and said gain medium.

9. The transmitter according to claim 8, further comprising:
   an optical reference source adapted to provide an optical reference signal;
   an optical mixer adapted to mix the optical reference signal and an output signal of said laser and to thereby generate an intermediate frequency signal; and
   a local reference source adapted to provide a local reference frequency, wherein said control circuit of said laser is adapted to compare the intermediate frequency with the local reference frequency, and to control said collimator to increase a phase when an output frequency is higher than the local reference frequency and to decrease the phase when the output frequency is lower than the local reference frequency.

10. The transmitter according to claim 9, wherein said control circuit is adapted to determine an amplitude of the intermediate frequency signal and to control a focal length of said collimator such that an amplitude of the output signal of said laser reaches a maximum.

11. The transmitter according to claim 9, wherein the local reference frequency is a quartz reference.

12. The transmitter according to claim 8, further comprising a monitor diode adapted to provide a feedback signal containing information about an amplitude of an output signal of said laser, wherein said control circuit is adapted to control a focal length of said collimator such that an amplitude of the output signal of said laser reaches a maximum.

13. An optical data transmission device, comprising:
   a heterodyne receiver; and
   a transmitter, containing:
   a laser including a laser cavity, a gain medium, a semitransparent mirror, said gain medium and said semitransparent mirror are disposed on opposite sides of said laser cavity, a control circuit and a collimator having a first electrostatically controllable liquid lens with a first optical axis and a second electrostatically controllable liquid lens with a second optical axis aligned with the first optical axis;
   an optical reference source adapted to provide an optical reference signal, said optical reference source being an input signal of said heterodyne receiver;
   an optical mixer adapted to mix the optical reference signal and an output signal of said laser and to thereby generate an intermediate frequency signal; and
   a local reference source adapted to provide a local reference frequency, wherein said control circuit of said laser is adapted to compare the intermediate frequency with the local reference frequency, and to control said collimator to increase a phase when an output frequency is higher than the local reference frequency and to decrease a phase when the output frequency is lower than the local reference frequency.

14. An optical data transmission device, comprising:
   a heterodyne receiver; and
   a transmitter, containing:
   a laser including a laser cavity, a gain medium, a semitransparent mirror, said gain medium and said semitransparent mirror are disposed on opposite sides of said laser cavity, a control circuit and a collimator having a first electrostatically controllable liquid lens with a first optical axis and a second electrostatically controllable liquid lens with a second optical axis aligned with the first optical axis;
   an optical reference source adapted to provide an optical reference signal, said optical reference source being an input signal of said heterodyne receiver;
   an optical mixer adapted to mix the optical reference signal and an output signal of said laser and to thereby generate an intermediate frequency signal, said optical mixer is a photo diode for receiving an optical data signal of said heterodyne receiver;
   a local reference source adapted to provide a local reference frequency, wherein said control circuit of said laser is adapted to compare the intermediate frequency with the local reference frequency, and to control said collimator to increase a phase when an output frequency is higher than the local reference frequency and to decrease the phase when the output frequency is lower than the local reference frequency;
   a monitor diode adapted to provide a feedback signal containing information about an amplitude of the output signal of said laser, wherein said control circuit is adapted to control a focal length of said collimator such that an amplitude of the output signal of said laser reaches a maximum.

15. An adjustment method, which comprises the steps of:
   providing a collimator containing a first electrostatically controllable liquid lens having a first optical axis and a second electrostatically controllable liquid lens having a second optical axis aligned with the first optical axis, wherein each of said liquid lenses is independently controllable, the liquid lenses are arranged close together forming a ball lens and the ball lens contains liquids with different refractive indices; and
   adjusting a phase of a laser cavity via the collimator.

16. A communications method, which comprises the steps of:
   providing a transmitter containing a laser, a laser cavity, a gain medium, a semitransparent mirror, the gain medium and the semitransparent mirror are disposed on opposite sides of the laser cavity, a control circuit, and a collimator having a first electrostatically controllable liquid lens with a first optical axis and a second electrostatically controllable liquid lens with a second optical axis aligned with the first optical axis wherein each of said liquid lenses is independently controllable, the liquid lenses are arranged close together forming a ball lens and the ball lens contains liquids with different refractive indices, wherein the collimator is disposed between the semi transparent mirror and the gain medium; and using the transmitter for data communication in an optical data network.

17. A communications method, which comprises the steps of:

providing an optical data transmission device having a heterodyne receiver and a transmitter, the transmitter containing:

a laser including a laser cavity, a gain medium, a semitransparent mirror, said gain medium and said semitransparent mirror are disposed on opposite sides of said laser cavity, a control circuit and a collimator having a first electrostatically controllable liquid lens with a first optical axis and a second electrostatically controllable liquid lens with a second optical axis aligned with the first optical axis;

an optical reference source adapted to provide an optical reference signal, the optical reference source being an input signal of the heterodyne receiver;

an optical mixer adapted to mix the optical reference signal and an output signal of the laser and to thereby generate an intermediate frequency signal;

a local reference source adapted to provide a local reference frequency, wherein said control circuit of said laser is adapted to compare the intermediate frequency with the local reference frequency, and to control said collimator to increase a phase when the output frequency is higher than the local reference frequency and to decrease the phase when the output frequency is lower than the local reference frequency; and using the optical data transmission device for data communication in an optical data network.

* * * * *